United States Patent
Wei et al.

(10) Patent No.: US 7,662,436 B1
(45) Date of Patent: Feb. 16, 2010

(54) METHOD OF SPIN COATING A FILM OF NON-UNIFORM THICKNESS

(75) Inventors: Yayi Wei, Altamont, NY (US); Stefan Brandl, Albany, NY (US)

(73) Assignee: Infineon Technologies AG, Munich (DE)

( * ) Notice: Subject to any disclaimer, the term of this patent is extended or adjusted under 35 U.S.C. 154(b) by 793 days.

(21) Appl. No.: 11/139,122

(22) Filed: May 27, 2005

(51) Int. Cl.
*B05D 3/12* (2006.01)

(52) U.S. Cl. .......... 427/240; 427/261; 427/402; 427/425; 118/52; 118/320; 438/758

(58) Field of Classification Search .......... 427/240, 427/425, 402, 261; 118/52, 320; 438/758
See application file for complete search history.

(56) References Cited

U.S. PATENT DOCUMENTS

| | | | |
|---|---|---|---|
| 4,027,686 A | 6/1977 | Shortes et al. | |
| 4,741,926 A | 5/1988 | White et al. | |
| 5,070,813 A | 12/1991 | Sakai et al. | |
| 5,358,740 A | 10/1994 | Bornside et al. | |
| 5,405,813 A | 4/1995 | Rodrigues | |
| 5,555,902 A | 9/1996 | Menon | |
| 5,677,001 A | 10/1997 | Wang et al. | |
| 5,798,140 A * | 8/1998 | Parodi et al. | 427/240 |
| 5,902,399 A * | 5/1999 | Courtenay | 118/52 |
| 6,004,622 A | 12/1999 | Yen et al. | |
| 6,251,487 B1 | 6/2001 | Yonaha | |
| 6,559,215 B2 | 5/2003 | Mills et al. | |
| 6,652,911 B2 * | 11/2003 | Kim et al. | 427/240 |
| 6,716,285 B1 | 4/2004 | Weyburne et al. | |
| 6,849,293 B2 | 2/2005 | Rawat | |
| 6,875,467 B2 * | 4/2005 | Sigoli et al. | 427/240 |
| 7,199,062 B2 * | 4/2007 | Wei | 438/758 |
| 2001/0050050 A1 * | 12/2001 | Nishiya et al. | 118/668 |
| 2004/0232570 A1 * | 11/2004 | Hayashi et al. | 264/1.1 |

FOREIGN PATENT DOCUMENTS

JP     2001-143998     5/2001

* cited by examiner

*Primary Examiner*—Kirsten C Jolley
(74) *Attorney, Agent, or Firm*—Slater & Matsil, L.L.P.

(57) ABSTRACT

Embodiments of the invention provide a method for spin coating a film onto a substrate. Preferred embodiments deposit a film, such as a resist, having a thickness gradient from the substrate's centrifugal center to its edge. The gradient may be linear or stepwise continuous, for example. Other embodiments of the invention provide a semiconductor fabrication method. The method comprises forming a resist layer having a predetermined thickness on a substrate. Preferably, the predetermining includes making swing curve measurements on a single test wafer that is coated according to embodiments of the invention.

19 Claims, 3 Drawing Sheets

METHOD OF SPIN COATING A FILM OF NON-UNIFORM THICKNESS

TECHNICAL FIELD

This invention relates generally to semiconductor manufacturing and, more particularly, to a method for spin coating a layer onto a substrate so that the layer has a radial thickness gradient.

BACKGROUND

Resist film thickness is an important parameter for a lithography process. The incident exposure light interferes with the light reflected from the substrate, forming an interference pattern. The feature size in the resist changes with the resist film thickness. Therefore, the resist film thickness has to be optimized to realize the best process window. The so-called swing-curve, which measures the variations of feature size vs. resist film thickness, is an effective approach to obtain the optimal resist film thickness.

The conventional swing-curve determination needs a series of wafers coated with resists of different thicknesses. The wafers are exposed with a fixed dose, and the feature sizes are measured after development. In a conventional process, different resist thicknesses are usually realized on different wafers. Each wafer is spin coated separately using different rotation speeds to realize certain thicknesses. There are several problems with this approach.

One problem is that too many wafers are needed for an accurate swing curve. Usually, 20-30 points are needed to plot a swing curve. This means that 20-30 wafers are required for the swing curve determination. Another problem is that process variations from wafer to wafer introduce additional errors into the measurements. Therefore, limiting wafer-introduced error requires that the substrates/wafers be as uniform as possible. Also, variations of process conditions from wafer to wafer have to be kept to a minimum.

In light of problems such as these, there remains a need for improved methods for generating resist swing curves in semiconductor manufacturing.

SUMMARY OF THE INVENTION

These and other problems are generally solved or circumvented, and technical advantages are generally achieved, by preferred embodiments of the present invention that provides a method for coating a substrate with a resist. In preferred embodiments of the invention, the resist thickness changes with distance from the centrifugal center of the substrate. Coating parameters can control the thickness variation across the wafer. Embodiments advantageously allow determination of a resist swing curve using only a single wafer. Neither a series of wafers with different resist thicknesses is needed, nor process variation of wafer-to-wafer is a concern.

A preferred embodiment of the invention provides a method for spin coating a film on a substrate. The method comprises spinning the substrate about a rotational axis, the rotational axis passing through a substrate center and perpendicular to a substrate surface. A liquid is added to the substrate by positioning a fluid source over the substrate at a first radial position and dispensing a fluid from the fluid source onto the substrate surface at the first radial distance. Preferably, dispensing includes spinning the substrate at a first rotational velocity.

Preferred embodiments of the invention allow for the creation of a film thickness distribution from the substrate center to its edge (a radial thickness gradient). Preferred embodiments include moving the fluid source across the surface of the substrate to a second radial distance from the substrate center. Embodiments preferably include dispensing the fluid from the resist source onto the substrate surface during the moving or shortly thereafter. Preferably, moving the fluid source includes adjusting the spinning to a second rotational velocity.

The spin coating may include a resist, a photoresist, a dielectric, an adhesive, a conductor, and combinations thereof. It may include a volatile and a nonvolatile component, wherein the volatile component evaporates from the substrate surface thereby leaving a film on the substrate surface, with the film comprising the nonvolatile component. Embodiments of the invention extend to other fluids, which include a liquid, a gas, a spray, a supercritical fluid, and combinations thereof.

In other embodiments, a rotational velocity comprises one of clockwise and counterclockwise rotation, and a second rotational velocity comprises the other of clockwise and counterclockwise rotation. Other rotational velocity changes may include a linear ramp-up or a plurality of discrete step changes.

Other embodiments of the invention include selecting a plurality of radial locations on the wafer for dispensing the resist thereupon, and further selecting a plurality of wafer rotation speeds. Each of the wafer rotation speeds corresponds to one of the radial locations, and the selecting comprises calculating a resist thickness using a predetermined algorithm that includes wafer rotation speed and radial location. Embodiments include dispensing the resist onto the wafer at a preselected radial location while rotating the wafer at a corresponding rotation speed and repeating for each of the plurality radial locations.

Yet still other embodiments of the invention provide a semiconductor fabrication method. The method comprises forming a resist layer having a predetermined thickness on a substrate, wherein other embodiments allow for the predetermining. Preferably, the predetermined thickness is an optimum resist thickness such as may be found from a resist swing curve. Embodiments further include transferring a mask pattern onto the resist layer followed by exposing the resist layer to form a pattern over the substrate, and affecting the substrate, such as by etching, using the pattern over the substrate.

Note that although the term layer is used throughout the specification and in the claims, the resulting features formed using the layer should not be interpreted together as only a continuous or uninterrupted feature. As will be clear from reading the specification, the semiconductor layer will be separated into distinct and isolated features (e.g., active regions), some or all of which comprise portions of the semiconductor layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for depositing a resist film on a surface of a substrate such as a semiconductor wafer. Preferred embodiments of the invention provide a method for forming a resist having a thickness gradient in the radial direction. Embodiments are particularly useful for determining a resist swing curve because, unlike conventional methods, only a single test wafer is required.

In one embodiment, the resist film is thinnest at the wafer center and thickest at the wafer edge, and the gradient is linear gradient. In another embodiment the gradient comprises a plurality of steps.

Turning now to FIG. 1, which includes 1a and 1b, there is illustrated a first preferred embodiment of the invention. For illustrative purposes, the structure in the figure is a perspective view of a semiconductor device such as an integrated circuit at an intermediate stage in fabrication. In FIG. 1, the device comprises a substrate 110 having a rotational axis 115 through the center of the substrate 110 and perpendicular to its surface. In embodiments of the invention, the substrate 110 is rotated, or spun, about the rotational axis 115 at an angular velocity, $\omega$, which is expressed in revolutions per minute (rpm). This configuration and suitable equipment for performing this process are widely used for spin coating in the semiconductor arts.

As the substrate 110 is rotated, centrifugal force accelerates the liquid across the substrate 110 surface from its centrifugal center towards its edge. The substrate 110 may include a conventional silicon wafer having a radius, R, up to 15 cm, or larger. Radial location on the substrate 110 may be described by the variable r, wherein $0 \leq r \leq R$.

Figure 1A:
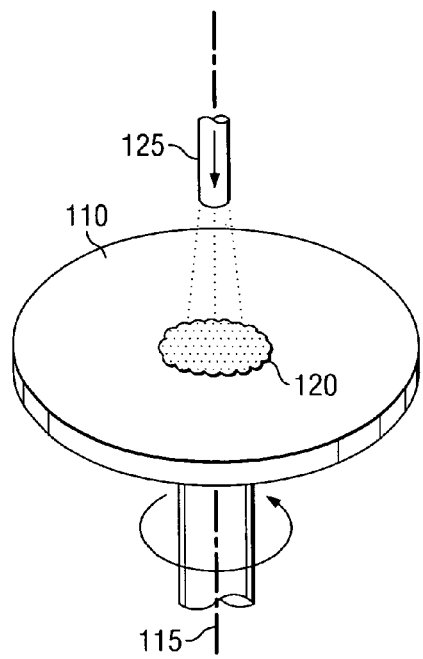
FIGS. 1a and 1b are perspective views illustrating spin coating of a first layer according to an embodiment of the invention.
Figure 1B:
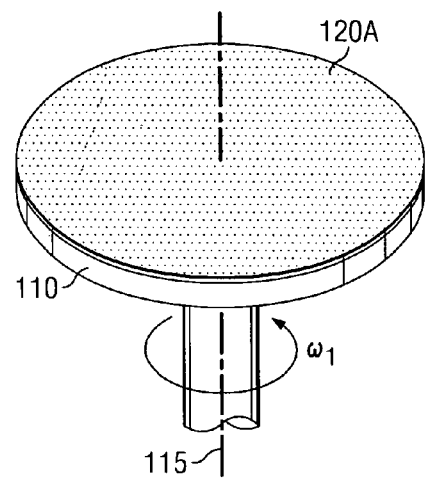

In the embodiment of FIG. 1a, there is a resist 120 deposited on the substrate 110. As shown in FIG. 1a, the resist 120 is dispensed from a resist source 125, which is positioned over the center of a stationary substrate 110. In other embodiments, the resist 120 may be dispensed at another location with or without rotation. After dispensing a suitable volume of resist 120, the substrate is rotated at a first angular velocity, $\omega_1$, thereby forming the resist 120 into a first layer 120A over the substrate 110, as illustrated in FIG. 1b. Preferably, the first layer 120A has a substantially uniform thickness. In other embodiments, not illustrated, a bottom antireflective coating (BARC) layer is formed between the resist 120 and the substrate 110.

The substrate 110 may be a material such as Si, SiGe, GaAs, InP, GaN, SiGe graded buffer, silicon on insulator (SOI), II-VI or III-V compound semiconductors, or combinations thereof. In other embodiments, the substrate may include another device or an intermediate device such as a capacitor, a memory array, or an interlevel wiring arrangement, for example.

While the exemplary embodiment of FIG. 1 is illustrated by forming a resist layer, other fluids are within the scope of the invention. The fluid may comprise a liquid such as a photoresist, a dielectric, an adhesive, a conductor, and combinations thereof. In preferred embodiments, the fluid comprises a volatile and a nonvolatile component. As centrifugal forces spin up the fluid, the volatile component evaporates thereby leaving a film of the nonvolatile component. In addition to liquids, the fluid may be a gas, a spray, or a supercritical fluid, for example.

Figure 2A:
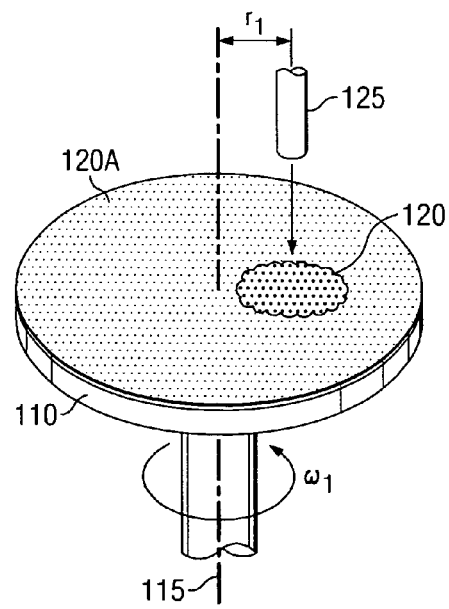
FIGS. 2a and 2b are perspective views illustrating spin coating of a second layer according to an embodiment of the invention.
Figure 2B:
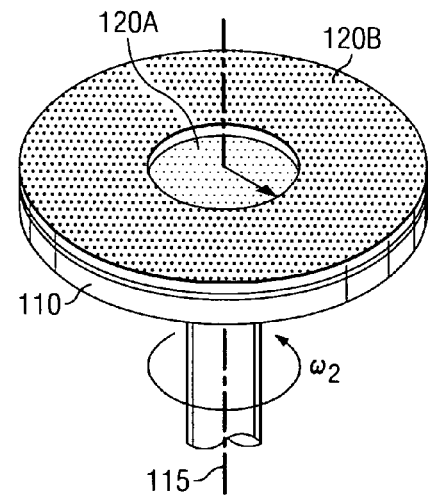

Turning now to FIG. 2, which includes FIGS. 2a and 2b, there is illustrated the intermediate device of FIG. 1 after further processing. As illustrated in FIG. 2a, the resist source 125 is repositioned from the center of the substrate 110 to a first radial location, $r_1$ while spinning at the first angular velocity.

After dispensing the resist 120 onto the first layer 120A, the substrate 110 is accelerated to a second angular velocity, $\omega_2$, thereby forming a second layer 120B. The acceleration may include a step change in rotation, or it may change more smoothly. In embodiments of the invention, the first, second, and/or subsequent rotational velocity may be unequal, but this is not necessarily so.

Preferably, there is substantially none of the second layer 120B formed inside of an annular region defined by the resist source 125. That is, the region covered by the first layer 120A is $0 \leq r \leq R$, and the region covered by the second layer 120B is $r_1 \leq r \leq R$.

Figure 3A:
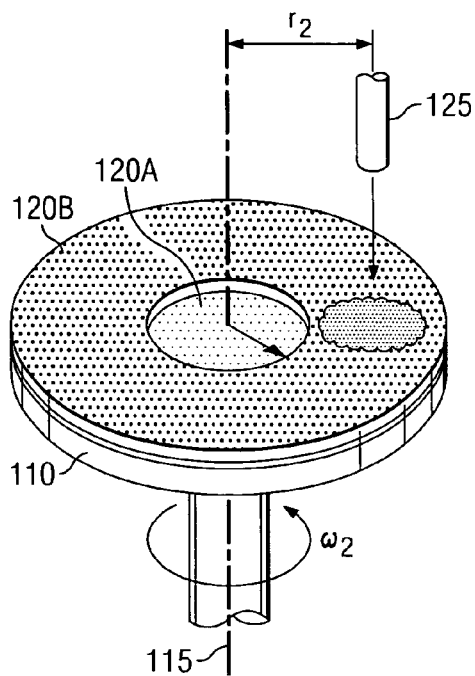
FIGS. 3a and 3b are perspective views illustrating spin coating of a third layer according to an embodiment of the invention.

The process illustrated in FIG. 2, may be repeated, as illustrated in FIG. 3. After repositioning the resist source 125 to a second radial location, $r_2$, the substrate 110 is accelerated to a third angular velocity, $\omega_3$, thereby forming a third layer 120C over the substrate 110. Preferably, the region covered by the third layer 120C is given by $r_2 \leq r \leq R$.

Figure 3B:
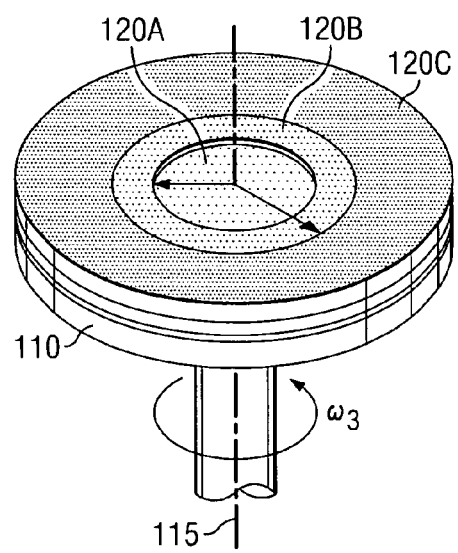
Figure 4:
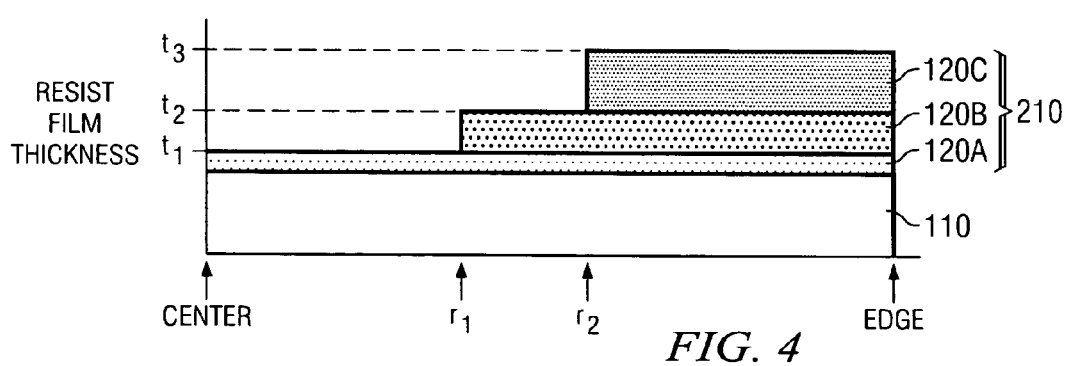
FIG. 4 is a side view illustrating three spin-coated layers according to an embodiment of the invention.

Turning now to FIG. 4, there is a side view of the intermediate device illustrated in FIG. 3b. As shown in FIG. 4, a non-uniform film 210 is formed over the substrate 110. Preferably, the non-uniform film 210 has a radial, or lateral, thickness gradient.

Figure 5:
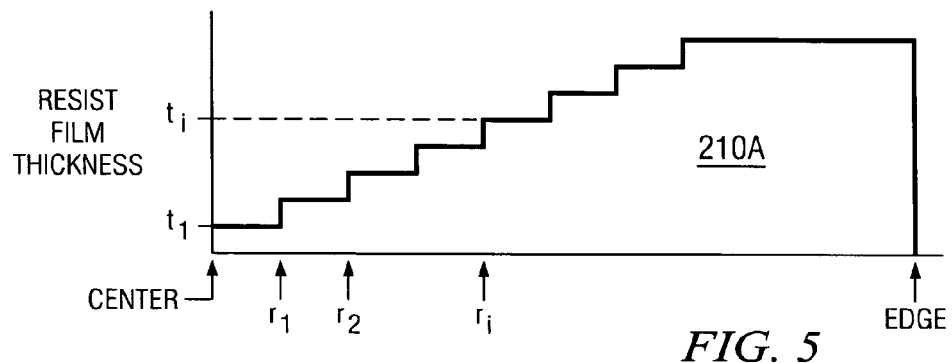
FIG. 5 is a side view illustrating a plurality of spin-coated layers according to an embodiment of the invention.

As described above, embodiments of the invention are advantageously used to fabricate resist-covered test wafers to measure resist swing curves. Since swing curves may require 20 or more data points, the embodiments described above may be generalized to a plurality of radial locations and rotation speeds. Such an embodiment is illustrated in FIG. 5, wherein a non-uniform layer 210A is formed having a plurality of different thickness regions.

Figure 6:
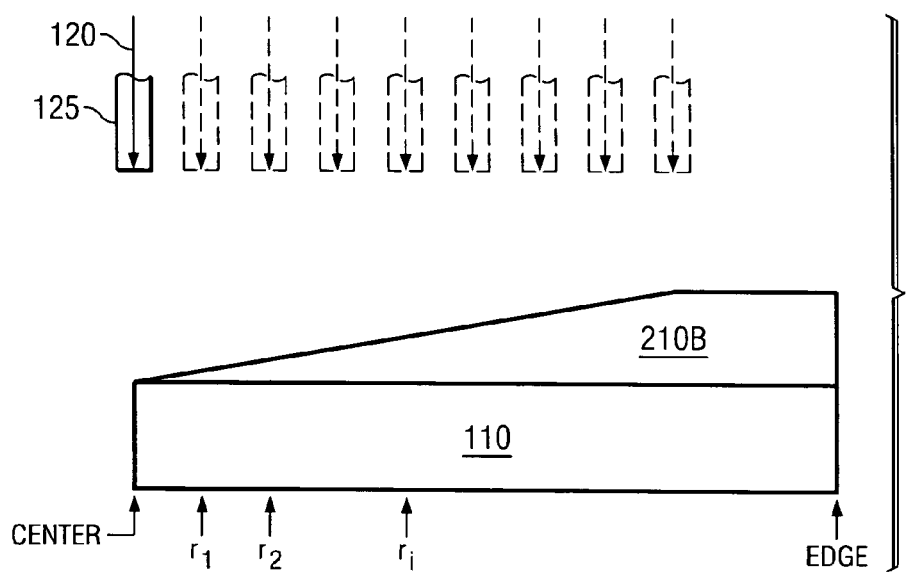
FIG. 6 is a side view illustrating a spin-coated layer having a linear thickness gradient according to an embodiment of the invention Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

Embodiments of the invention described above included processing parameters such as incremental movements of the resist source. Such movement combined with an appropriate rotation scheme produced a layer having a lateral thickness gradient that is essentially stepwise continuous. Other embodiments of the invention include ramped parameter transitions to produce a layer that includes a linear thickness gradient, such as illustrated in FIG. 6. As shown in FIG. 6, the resist source 125 may be gradually translated through a series of radial locations to produce a ramped film substantially as shown.

As noted, embodiments of the invention provide preferred methods of resist swing curve measurements using a single wafer. Methods include coating a wafer or a substrate with a resist. Preferably, the resist thickness increases from the center of the wafer to the edge. A resist thickness monitor may measure the resist's radial thickness gradient across the wafer. Conventional step-and-scan methods expose a line and space pattern across the wafer. The line width of the pattern is measured at different radial locations. The measured line width is plotted as a function of radial position and resist thickness.

Embodiments are particularly advantageous in the wide array of achievable lateral thickness profiles. Preferably, film thickness profiles as a function of spin coating parameters ate predetermined, i.e., determined before fabricating the device. The predetermining may include empirical calibration experiments, calculations based on spin coating theory, or a combination thereof.

For example, according to basic spin coating theory, film thickness, t, is proportional to $\omega^{-1/2}$, i.e., $t=k\cdot\omega^{-1/2}$, where k is the resist coefficient, which is a function of viscosity and coating environment. As described above, the film in the region defined by $r_1<r<r_2$ includes two layers: a lower layer formed in a first dispense and a upper layer formed in a second dispense. The total thickness is the sum of the two layers, i.e. $t_2=t_1+k\cdot\omega_2^{-1/2}$. This relation is generalized to a plurality of layers (n layers) by the equation $t_n=t_{n-1}+k\cdot\omega_n^{-1/2}$. Such semi-empirical relations enable the predetermining of an algorithm that includes the effect of spin coating parameters on film thickness profile. Having made this predetermination, a suitable film thickness profile is achieved by selecting the appropriate processing parameters.

Processing parameters may include may include angular acceleration, rotation velocity, rotation duration or period, dispensing flow rate, dispensing location, distance of the fluid source from the substrate, for example. In other embodiments, the wafer rotation may be held constant for one or more dispensing steps. Still other embodiments may include clockwise and counterclockwise rotations.

For example, a first dispensing step may include accelerating a wafer clockwise to a first rotational velocity. The next step may include maintaining the first rotational velocity for a first period. It may thereafter be accelerated to a second rotational velocity. In an embodiment of the invention, the second rotational velocity is opposite the first rotational velocity. The magnitudes of the first and second velocities may be the same or different. An embodiment for spinning on a resist using clockwise/counterclockwise rotations is described in co-pending and commonly assigned U.S. patent application Ser. No. 11/098,181, filed on Apr. 4, 2005, entitled "Method for Forming a Resist Film on a Substrate having Non-Uniform Topography," which application is hereby incorporated herein by reference.

The series of steps may further include one or more periods of no rotation. For example, a series of steps may include a period of clockwise rotation, a period of no rotation, and a period of either clockwise or counterclockwise rotation. In other embodiments, a clockwise rotation step may proceed substantially instantaneously to a counterclockwise rotation, with no pause between rotations. Rotational pauses or velocity changes may occur before, during, or after the dispensing of the resist.

The duration of acceleration periods and constant rotation periods, may be up to several minutes, but preferably less than 60 seconds, and more preferably less than about 10 seconds. Rotational velocities up to 3000 rpm, or greater, are within the contemplation of embodiments of the invention.

Although the present invention and its advantages have been described in detail, it should be understood that various changes, substitutions and alterations may be made herein without departing from the spirit and scope of the invention. For example, the embodiments described herein are equally suitable for front end of the line (FEOL) or back end of the line (BEOL) processing. They are suitable for wafers, intermediate devices, finished devices, and other substrates not generally used in semiconductor manufacturing.

Still another embodiment provides a method of semiconductor device fabrication. The method comprises forming a resist layer having a predetermined thickness on a substrate. Preferably, predetermining the thickness includes selecting a plurality of radial locations on a test wafer for dispensing a resist thereupon, and further selecting a plurality of wafer rotation speeds, wherein each of the wafer rotation speeds corresponds to one of the radial locations. Preferred predetermining methods further include dispensing the resist onto the test wafer at a selected radial location while rotating the wafer at a corresponding rotation speed. The dispensing is repeated for each of the wafer rotation speeds and corresponding radial locations. The test wafer is thereafter exposed and developed. Finally, in preferred embodiments, predetermining the thickness further includes selecting an optimum resist thickness using swing curve selection criteria.

Conventional methods may complete the semiconductor fabrication. These may include baking the substrate to remove solvents until the resist is suitably hardened; and transferring a mask pattern onto the resist followed by exposing the resist film, and developing the resist film to form a pattern over the substrate. Embodiments may further include effecting the substrate using the mask pattern, wherein effecting the substrate comprises etching a layer of the substrate.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method for spin coating a film on a substrate, the method comprising:
spinning the substrate about a rotational axis, the rotational axis passing through a substrate center and perpendicular to a substrate surface;
positioning a fluid source over the substrate at a first radial position;

dispensing a fluid from the fluid source onto the substrate surface at the first radial position while spinning the substrate at a first rotational velocity; and moving the fluid source across the surface of the substrate to a second radial position from the substrate center, wherein moving the fluid source comprises:

dispensing the fluid from the fluid source onto the substrate surface; and spinning the substrate at a second rotational velocity;

wherein the first radial position is closer to the substrate center than the second radial position, and wherein the first rotational velocity is slower than the second rotational velocity.

2. The method of claim 1, wherein the first rotational velocity comprises one of clockwise and counterclockwise rotation, and the second rotational velocity comprises the other of clockwise and counterclockwise rotation.

3. The method of claim 1, wherein adjusting the spinning to the second rotational velocity comprises linearly ramping rotational velocity from the first to second rotational velocity.

4. The method of claim 1, wherein adjusting the spinning to the second rotational velocity comprises a plurality of intermediate step changes in velocity.

5. The method of claim 4, wherein the plurality of intermediate step changes in velocity includes at least three step changes.

6. The method of claim 1, wherein the fluid comprises a volatile and a nonvolatile component, wherein the volatile component evaporates from the substrate surface thereby leaving a film on the substrate surface, the film comprising the nonvolatile component.

7. The method of claim 1, wherein the fluid comprises a material selected from the group consisting essentially of a liquid, a gas, a spray, a supercritical fluid, and combinations thereof.

8. The method of claim 1, wherein spinning the substrate about the rotational axis comprises spinning the substrate up to about 3,000 rpm.

9. The method of claim 1, wherein the substrate comprises a partially fabricated integrated circuit on a semiconductor wafer.

10. The method of claim 1, wherein the substrate comprises a material selected from the group consisting essentially of Si, SiGe, GaAs, Inp, GaN, silicon on insulator (SOI), and combinations thereof.

11. The method of claim 1, wherein a thickness of the film increases from the center of the substrate to the edge of the substrate.

12. The method of claim 1, wherein dispensing the fluid from the first radial position forms a first portion of the film and wherein dispensing the fluid from the second radial position forms a second portion of the film.

13. The method of claim 1, wherein the film is formed non-uniformly over the substrate.

14. A method for spin coating a resist onto a substrate, the method comprising:

selecting a plurality of radial locations on the substrate for dispensing the resist thereupon, and further selecting a plurality of substrate rotation speeds, wherein each of the substrate rotation speeds corresponds to one of the radial locations, and wherein the selecting comprises calculating a resist thickness using a predetermined algorithm that includes substrate rotation speed and radial location;

dispensing the resist onto the substrate at a first radial location while rotating the substrate at a corresponding rotation speed, forming a first layer of resist having a first thickness; and repeating the dispensing the resist onto the substrate for each of the plurality of substrate rotation speeds and each of the plurality of radial locations;

forming one layer with a respective thickness for each of the plurality of radial locations, wherein a compound layer is formed from the plurality of layers and wherein the compound layer has non-uniform thickness.

15. The method of claim 14, wherein the plurality of radial locations comprises at least 3 radial locations.

16. The method of claim 14, wherein the plurality of substrate rotation speeds comprise a clockwise rotation, and a counterclockwise rotation.

17. The method of claim 14, wherein repeating the dispensing the resist comprises linearly ramping the rotating of the substrate from a first rotational velocity to a second rotational velocity.

18. The method of claim 14, wherein adjusting the rotation speed from the first radial location to a next radial location comprises linearly ramping rotational velocity from the first to a next rotational speed.

19. The method of claim 14, wherein adjusting the rotation speed from the first radial location to a next radial location comprises discretely ramping rotational velocity from the first to a next rotational speed.

\* \* \* \* \*